US007820463B2

United States Patent
Song

(10) Patent No.: US 7,820,463 B2
(45) Date of Patent: Oct. 26, 2010

(54) NITRIDE-BASED LIGHT EMITTING DEVICE AND MANUFACTURING METHOD THEREOF

(75) Inventor: June O Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 244 days.

(21) Appl. No.: 12/192,360

(22) Filed: Aug. 15, 2008

(65) Prior Publication Data

US 2008/0305567 A1    Dec. 11, 2008

Related U.S. Application Data

(62) Division of application No. 11/501,360, filed on Aug. 9, 2006, now Pat. No. 7,427,785.

(30) Foreign Application Priority Data

Aug. 9, 2005    (KR) .................. 10-2005-0072527

(51) Int. Cl.
*H01L 21/00* (2006.01)
*H01L 21/44* (2006.01)

(52) U.S. Cl. .............. 438/29; 438/34; 438/609; 257/E33.013; 257/E33.025; 257/E33.026

(58) Field of Classification Search ............ 438/29, 438/34, 609; 257/E33.013, E33.025, E33.026
See application file for complete search history.

(56) References Cited

U.S. PATENT DOCUMENTS

| 7,355,216 | B2  |    | 4/2008  | Yang et al. |
|---|---|---|---|---|
| 7,427,785 | B2 | * | 9/2008 | Song ............... 257/99 |
| 2004/0262636 | A1 |  | 12/2004 | Yang et al. |
| 2005/0082543 | A1 |  | 4/2005 | Alizadeh et al. |
| 2005/0107870 | A1 |  | 5/2005 | Wang et al. |
| 2006/0260674 | A1 | * | 11/2006 | Tran ............... 136/252 |
| 2007/0248132 | A1 |  | 10/2007 | Kikuchi et al. |
| 2009/0116277 | A1 | * | 5/2009 | Tran ............... 365/151 |

FOREIGN PATENT DOCUMENTS

KR    1020050063668    6/2005

* cited by examiner

*Primary Examiner*—Ngan Ngo
(74) *Attorney, Agent, or Firm*—Cantor Colburn LLP

(57) ABSTRACT

A light emitting device according to an exemplary embodiment of the present invention includes: an n-type cladding layer; a p-type cladding layer; an active layer interposed between the n-type cladding layer and the p-type cladding layer; and an ohmic contact layer contacting the p-type cladding layer or the n-type cladding layer and comprising a first film that comprises a transparent conductive zinc oxide having a one-dimensional nano structure, wherein the one-dimensional nano structure is at least one selected from a nanocolumn, a nano rod, and a nano wire.

7 Claims, 7 Drawing Sheets

NITRIDE-BASED LIGHT EMITTING DEVICE AND MANUFACTURING METHOD THEREOF

CROSS-REFERENCE TO RELATED APPLICATION

This Application is divisional application of U.S. application Ser. No. a 11/501,360 filed Aug. 9, 2006, which claims priority to Korean patent application number 10-2005-0072527, filed on Aug. 9, 2005 and all the benefits accruing therefrom under 35 U.S.C. §119, and the contents of which in its entirety are herein incorporated by reference.

BACKGROUND OF THE INVENTION (a) Field of the Invention

The present invention relates a light emitting device and a manufacturing method thereof, and, in particular, to a top-emission nitride-based light emitting device and a manufacturing method thereof.

(b) Description of the Related Art

Generally, a top-emission nitride-based light emitting device includes a p-type nitride-based cladding layer, an n-type nitride-based cladding layer, and a nitride-based active layer interposed therebetween. In the nitride-based light emitting device, light generated in the active layer passes through the n-type or p-type cladding layer to emit.

The p-type nitride-based cladding layer has a low hole concentration to have high sheet resistance. In order to compensate for the high sheet resistance, a thin ohmic contact layer including a nickel (Ni) thin film and a gold (Au) thin film is suggested to be employed.

However, when the light passes through the p-type cladding layer, the light emitting device has low emission efficiency due to the poor transmittance of the Ni—Au thin films and is thermally unstable due to the small thickness of the Ni—Au thin films.

Therefore, transparent conductive oxides such as indium-tin oxide (ITO) and zinc oxide (ZnO) are introduced as the material of the ohmic contact layer.

However, ITO or ZnO forms a schottky contact at an interface to cause great voltage drop and has large sheet resistance such that the operating voltage of the light emitting device is increased.

In the meantime, a structure for emitting light through the n-type nitride-based cladding layer is suggested. The structure includes a reflective p-type ohmic contact layer under the active layer and an n-type ohmic contact layer along with an electrode pad having a small contact area on the active layer so that the emission efficiency may be increased and heat generated during the operation of the light emitting device may be easily dissipated. However, the surface of the n-type nitride-based cladding layer in the above-described light emitting device may be apt to be oxidized due to the heat generated during the operation of the light emitting device, thereby degrading the reliability of the light emitting device. Accordingly, transparent conductive materials that are hardly oxidized are introduced as the material of the ohmic contact layer for the n-type nitride-based cladding layer.

Examples of widely-known transparent conductive materials include transparent conductive oxides such as ITO, $In_2O_3$, $SnO_2$, and ZnO and transparent conductive nitrides such as titanium nitride (TiN).

However, when the above-described transparent conductive oxides and nitrides are deposited by conventional techniques including chemical vapor deposition (CVD) and physical vapor deposition such as sputtering, electron beam deposition and thermal deposition, deposited thin films have large sheet resistance. In addition, the transparent conductive oxides and nitrides have workfunction that is small and difficult to be adjusted, thereby forming high contact barrier and resistance.

Moreover, the transparent conductive thin films have high reflectance and absorbance for the light generated in the active layer and have refractive indices higher than air and two-dimensional flat interfaces, thereby further decreasing the emission efficiency of the light emitting device.

SUMMARY OF THE INVENTION

A light emitting device according to an exemplary embodiment of the present invention includes: an n-type cladding layer; a p-type cladding layer; an active layer interposed between the n-type cladding layer and the p-type cladding layer; and an ohmic contact layer contacting the p-type cladding layer or the n-type cladding layer and comprising a first film that comprises a transparent conductive zinc oxide having a one-dimensional nano structure, wherein the one-dimensional nano structure is at least one selected from a nano-column, a nano rod, and a nano wire.

The n-type cladding layer, the p-type cladding layer, and the active layer may include nitrogen, and in particular, may include a group III nitride-based compound such as a compound having $Al_xIn_yGa_zN$ where x, y and z are integers.

The first film further may include an additional ingredient comprising at least one of aluminum (Al), chromium (Cr), silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), cadmium (Cd), lanthanum (La), and oxides thereof. An amount of the additional ingredient may be from about 0.1 weight % to about 49 weight %.

The first film may have a thickness equal to or greater than about ten nanometers.

The ohmic contact layer may further include a second film disposed between the first film and the p-type cladding layer or the n-type cladding layer, and the second film comprises at least one of metals including Ni, Pd, Pt, Rh, Zn, In, Sn, Zn, Ag, and Au, transparent conductive oxides including ITO, $SnO_2$, ZnO, $In_2O_3$, $Ga_2O_3$, $RhO_2$, NiO, CoO, PdO, PtO, $CuAlO_2$, CdO, and $CuGaO_2$, and transparent conductive nitrides including TiN, TaN, and SiNx.

The light emitting device may further include: a first electrode pad contacting the ohmic contact layer; and a second electrode pad electrically connected to the p-type cladding layer or the n-type cladding layer and disconnected from the first electrode pad.

The light emitting device may further include: a substrate; a bonding layer disposed on the substrate; a reflective layer disposed on the bonding layer and disposed under the p-type cladding layer or the n-type cladding layer; and an electrode pad contacting the ohmic contact layer.

A method of manufacturing a light emitting device according to an exemplary embodiment of the present invention includes: forming an n-type cladding layer, an active layer, and a p-type cladding layer on a substrate; forming a transparent conductive zinc oxide film of an ohmic contact layer, the zinc oxide film having a nano structure; and heat treating the zinc oxide film.

The formation of the zinc oxide film may include: depositing a two-dimensional thin film of zinc oxide; and etching and re-growing the two-dimensional thin film under an atmosphere including a hydrogen gas.

The zinc oxide film may include at least one of aluminum (Al), chromium (Cr), silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), cadmium (Cd), lanthanum (La), and oxides thereof.

The method may further include: forming an ohmic interlayer under the zinc oxide film, wherein the ohmic interlayer comprises at least one of metals including Ni Pd, Pt, Rh, Zn, In, Sn, Ag, Au, Cd, Mg, Be, Mo, V, Cu, Ti Ir, Ru, W, Co, Mn, and La, transparent conductive oxides including ITO, $SnO_2$, ZnO, $In_2O_3$, $Ga_2O_3$, $RhO_2$, NiO, CoO, PdO, PtO, $CuAlO_2$, CdO, and $CuGaO_2$, and transparent conductive nitrides including TiN, TaN, and SiNx.

The method may further include: performing heat treatment after the formation of the ohmic interlayer and before the formation of the zinc oxide film. The heat treatment before the formation of the zinc oxide film is performed at a temperature equal to or lower than about 800° C. and under a vacuum or under an atmosphere of oxygen ($O_2$), nitrogen ($N_2$), argon (Ar), hydrogen ($H_2$), or air.

The method may further include: performing plasma treatment on the zinc oxide film by using ions of such as oxygen ($O_2$), nitrogen ($N_2$), hydrogen ($H_2$), or argon (Ar) at a temperature equal to or lower than about 800° C.

DETAILED DESCRIPTION OF THE EMBODIMENTS

Figure 1:
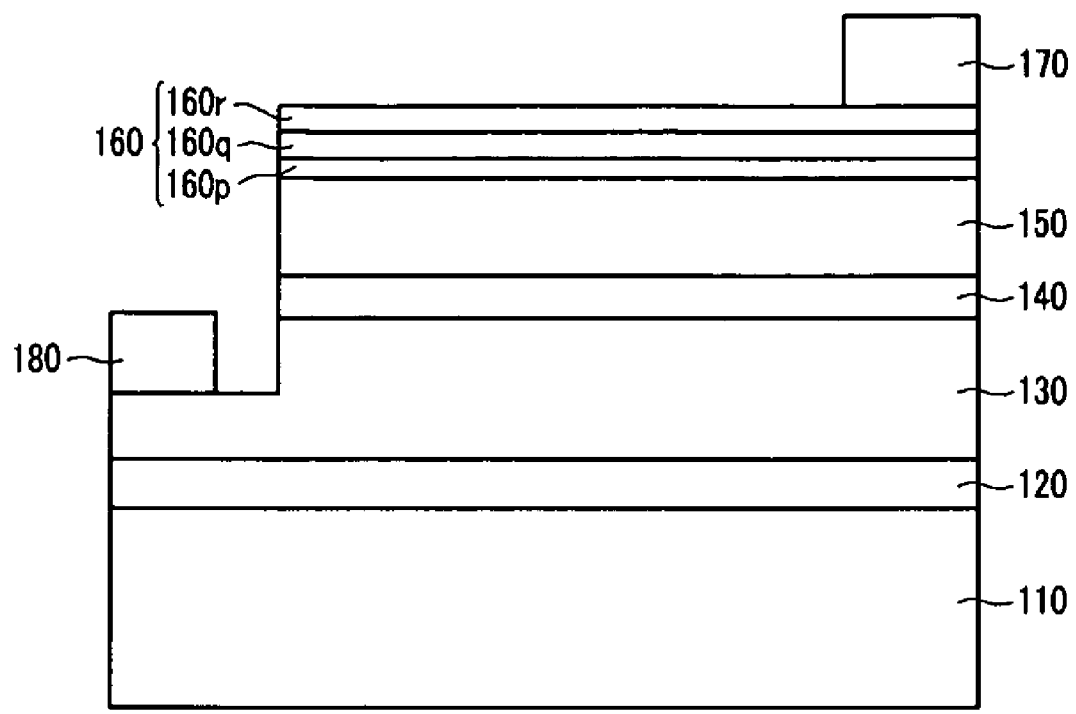
FIG. 1 is a sectional view of a top-emission nitride-based light emitting device having a MESA structure according to an exemplary embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein. In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, light emitting devices according to embodiments of the present invention is described in detail with reference to FIG. 1, FIG. 2, FIG. 3, and FIG. 4.

FIG. 1 is a sectional view of a top-emission nitride-based light emitting device having a MESA structure according to an exemplary embodiment of the present invention.

Referring to FIG. 1, a nitride-based buffer layer 120, an n-type nitride-based cladding layer 130, a nitride-based active layer 140, a p-type nitride-based cladding layer 150, and an ohmic contact layer 160 are sequentially formed on a substrate 110. A p-type electrode pad 170 is formed aside on the ohmic contact layer 160, and an n-type electrode pad 180 is formed aside on the n-type cladding layer 130.

The substrate 110 may be made of an insulating material such as sapphire ($Al_2O_3$), and the nitride-based buffer layer 120 may be omitted.

Each layer of from the buffer layer 120 to the p-type cladding layer 150 basically includes a group III nitride-based compound, for example, a compound having $Al_xIn_yGa_zN$ (where x, y and z are integers). The n-type cladding layer 130 further includes an n-type dopant as well as the group III nitride-based compound, and the p-type cladding layer 150 further includes a p-type dopant as well as the group III nitride-based compound. The active layer 140 generates light and may be single crystalline. The active layer 140 may have a single-layer structure or a multi-quantum well (MQW) structure.

For example, when employing a gallium nitride (GaN) compound, the nitride-based buffer layer 120 may be made of GaN, and the n-type cladding layer 130 may be made of GaN doped with n-type dopant such as Si, Ge, Se or Te. The active layer 140 may have a MQW structure of InGaN and GaN or a MQW structure of AlGaN and GaN, and the p-type cladding layer 150 may be made of GaN doped with p-type dopant such as Mg, Zn, Ca, Sr or Ba.

The n-type cladding layer 130 includes a thick portion and a thin portion. The active layer 140, the p-type cladding layer 150, and the ohmic contact layer 160 are disposed on the thick portion of the n-type cladding layer 130, and the n-type electrode pad 180 on the thin portion thereof. This structure can be obtained by sequentially depositing the n-type cladding layer 130, the active layer 140, the p-type cladding layer 150, and the ohmic contact layer 160 and by etching them.

An n-type ohmic contact layer (not shown) may be interposed between the n-type cladding layer 130 and the n-type electrode pad 180. The n-type ohmic contact layer may have various structures, for example, a sequentially deposited structure of a titanium thin film and an aluminum thin film.

The p-type electrode pad 170 may have a sequentially deposited structure of a Ni thin film and an Au thin film, or of an Ag thin film and an Au thin film.

The ohmic contact layer 160 includes a lower film 160*p*, an intermediate film 160*q*, and an upper film 160*r*. At least one of the lower film 160*p* and the intermediate film 160*q* may be omitted.

The upper film 160*r* includes a one-dimensional nano structure such as nano-columns, nano-rods, or nano-wires.

The upper film 160*r* may be made of a transparent conductive zinc oxide (ZnO). Although the upper film 160*r* may only include zinc and oxide, the upper film 160*r* may further include an additional ingredient for adjusting electron concentration, energy bandgap, or refractive index of the zinc oxide. The additional ingredient may be a metal or an oxide thereof. Examples of the metal are aluminum (Al), chromium (Cr), silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), cadmium (Cd), and lanthanum (La). That is, the upper film 160r may include at least one of the above-listed metals and oxides thereof as the additional ingredients.

The amount of the additional ingredient may be from about 0.1 weight % to about 49 weight %.

The thickness of the upper film 160r may be equal to or greater than about 10 nanometers.

The upper film 160r may be directly grown to have the one-dimensional nano structure. However, the upper film 160r may be formed by depositing a two-dimensional thin film of zinc oxide and by etching and re-growing the two-dimensional thin film with heat treatment under an atmosphere including hydrogen gas ($H_2$).

The lower film 160p and the intermediate film 160q may be an ohmic interlayer for improving the ohmic contact characteristic between the p-type nitride-based cladding layer 150 and the upper film 160r.

Each of the lower film 160p and the intermediate film 160q may be made of one of metals including Ni, Pd, Pt, Rh, Zn, In, Sn, Ag, Au, Cd, Mg, Be, Mo, V, Cu, Ti Ir, Ru, W, Co, and Mn, transparent conductive oxides including ITO, $SnO_2$, ZnO, $In_2O_3$, $Ga_2O_3$, $RhO_2$, NiO, CoO, PdO, PtO, $CuAlO_2$, CdO, and $CuGaO_2$, and transparent conductive nitrides including TiN, TaN, and SiNx.

When forming the ohmic contact layer 160, after the lower film 160p and the intermediate film 160q are deposited, and before or after the upper film 160r is deposited, heat treatment may be performed at a temperature equal to or lower than about 800° C. and under a vacuum or under an atmosphere of various gases such as oxygen ($O_2$), nitrogen ($N_2$), argon (Ar), hydrogen ($H_2$), or air. The heat treatment may improve light transmittance and conductivity of the ohmic contact layer 160.

Furthermore, plasma treatment may be performed by using ions of such as oxygen ($O_2$), nitrogen ($N_2$), hydrogen ($H_2$), or argon (Ar) for improving optical and electrical characteristics of the upper film 160r.

Each layer may be formed by chemical vapor deposition (CVD) or physical vapor deposition (PVD).

An example of the CVD includes metalorganic chemical vapor deposition (MOCVD).

Examples of the PVD include evaporation, laser deposition, and sputtering. Examples of the evaporation are thermal evaporation and electron beam evaporation. The laser deposition may use a laser beam having high energy. The sputtering uses ions of oxygen ($O_2$), nitrogen ($N_2$), or argon (Ar), and the sputtering may use two or more sputtering guns, which is referred to as co-sputtering.

In the light emitting device shown in FIG. 1, the light generated in the active layer 140 passes through the p-type cladding layer 150 to emit, and the light emitting device may be used for small emitting area, low capacity, and low luminance.

Figure 2:
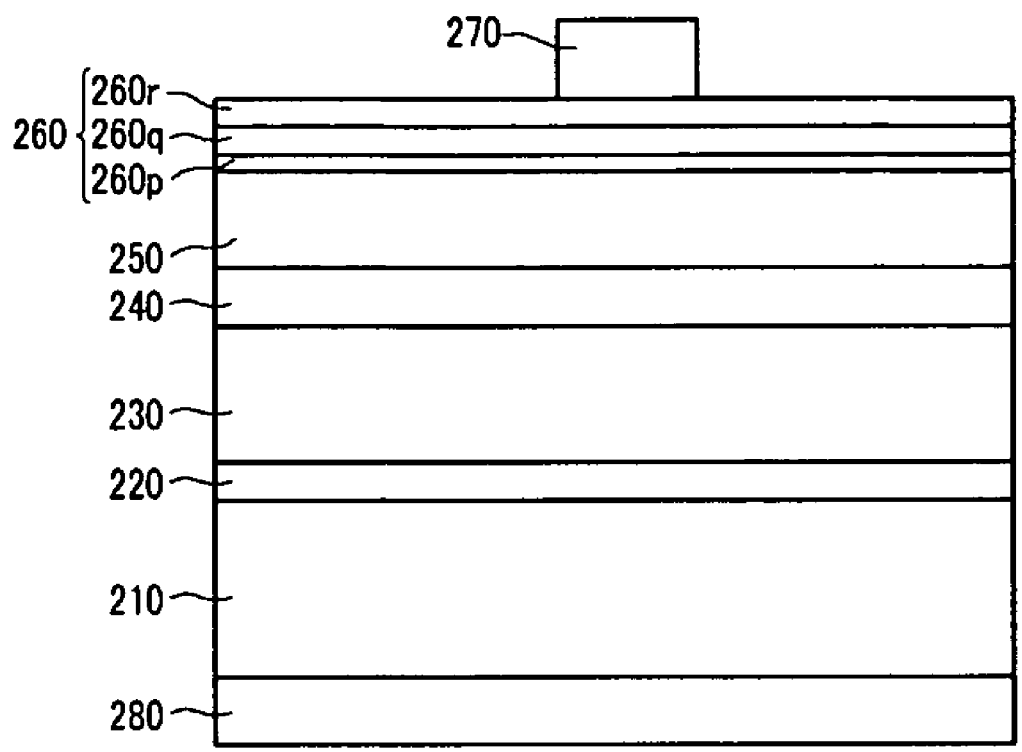
FIG. 2 is a sectional view of a top-emission nitride-based light emitting device having a vertical structure according to an exemplary embodiment of the present invention.

FIG. 2 is a sectional view of a top-emission nitride-based light emitting device having a vertical structure according to an exemplary embodiment of the present invention.

The layered structure of a light emitting device shown in FIG. 2 is similar to that shown in FIG. 1.

That is, a nitride-based buffer layer 220, an n-type nitride-based cladding layer 230, a nitride-based active layer 240, a p-type nitride-based cladding layer 250, and an ohmic contact layer 260 are sequentially formed on a substrate 210.

Unlike the light emitting device shown in FIG. 1, the substrate 210 of the light emitting device shown in FIG. 2 may be made of conductive silicon carbide (SiC). An n-type electrode pad 280 is disposed opposite the buffer layer 230 with respect to the substrate 210 and covers an entire surface. A p-type electrode pad 270 is formed on the ohmic contact layer 260 and disposed near the middle of the ohmic contact layer 260.

The n-type electrode pad 280 is an ohmic electrode pad, and may be made of a metal such as aluminum, rhodium, or silver having high reflectance. The n-type electrode pad 280 may have various layered structures.

The n-type cladding layer 130 has uniform thickness and thus there is no need to etching.

Since the light emitting device shown in FIG. 2 use the conductive substrate 210, the heat dissipation of the light emitting device is good and the light emitting device may be used for large area, large capacity, and high luminance.

Many features of the light emitting device shown in FIG. 1 may be applicable to the light emitting device shown in FIG. 2.

Figure 3:
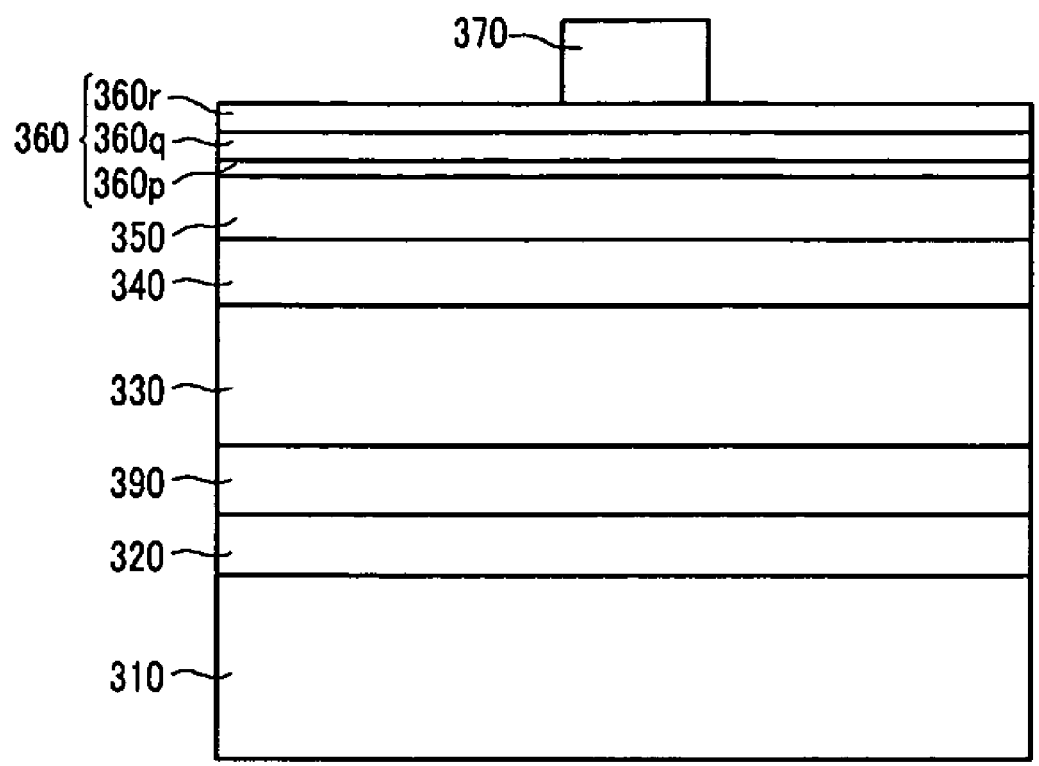
FIG. 3 is a sectional view of a top-emission nitride-based light emitting device having a vertical structure according to another exemplary embodiment of the present invention.

FIG. 3 is a sectional view of a top-emission nitride-based light emitting device having a vertical structure according to another exemplary embodiment of the present invention.

The layered structure of a light emitting device shown in FIG. 3 is similar to that shown in FIG. 2.

That is, an n-type nitride-based cladding layer 330, a nitride-based active layer 340, a p-type nitride-based cladding layer 350, an ohmic contact layer 360, and a p-type electrode pad 370 are sequentially formed on a substrate 310.

Unlike the light emitting device shown in FIG. 2, the light emitting device shown in FIG. 3 includes no n-type electrode pad, and includes a bonding layer 320 instead of the buffer layer 220. The substrate 310 may be made of a conductive semiconductor, a metal, etc.

A reflective layer 390 is formed between the bonding layer 320 and the n-type cladding layer 330, and the reflective layer 390 reflects the light from the active layer 340.

When manufacturing the light emitting device shown in FIG. 3, a structure including at least one of the reflective layer 390, the n-type nitride-based cladding layer 330, the nitride-based active layer 340, the p-type nitride-based cladding layer 350, the ohmic contact layer 360, and the p-type electrode pad 370 is formed on an insulation substrate (not shown) made of sapphire, etc. The structure is separated from the insulation substrate using laser lift off, and bonded onto the conductive substrate 310 via the bonding layer 320.

The light emitting device shown in FIG. 3 has also excellent heat dissipation and may be used for large area, large capacity, and high luminance.

Many features of the light emitting device shown in FIG. 2 may be applicable to the light emitting device shown in FIG. 3.

Figure 4:
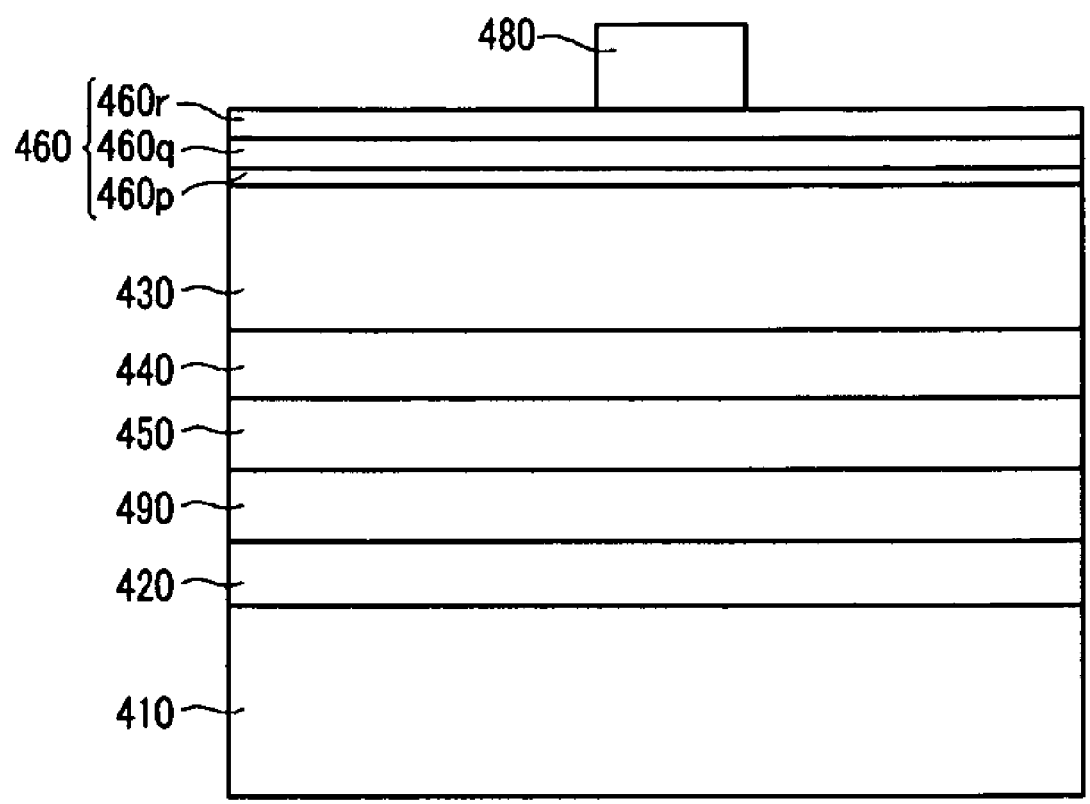
FIG. 4 is a sectional view of a top-emission nitride-based light emitting device having a vertical structure according to another exemplary embodiment of the present invention.

FIG. 4 is a sectional view of a top-emission nitride-based light emitting device having a vertical structure according to another exemplary embodiment of the present invention.

The layered structure of a light emitting device shown in FIG. 4 is similar to that shown in FIG. 3.

That is, a bonding layer 420 and a reflective layer 490 are sequentially on a substrate 410, and an n-type nitride-based cladding layer 430, a nitride-based the active layer 440, a p-type nitride-based cladding layer 450, and an ohmic contact layer 460 are formed thereon.

However, the relative positions of the n-type nitride-based cladding layer 430 and the p-type nitride-based cladding layer 450 in the light emitting device shown in FIG. 4 are exchanged as compared with those shown in FIG. 3. In addition, an n-type electrode pad 480 are formed instead of the p-type electrode pad 370.

Many features of the light emitting device shown in FIG. 3 may be applicable to the light emitting device shown in FIG. 4.

The light emitting device including the above-described nano-structured ohmic contact layer improves the interface characteristic of the ohmic contact layer to show improved current-voltage characteristics and increases emission efficiency.

Figure 5A:
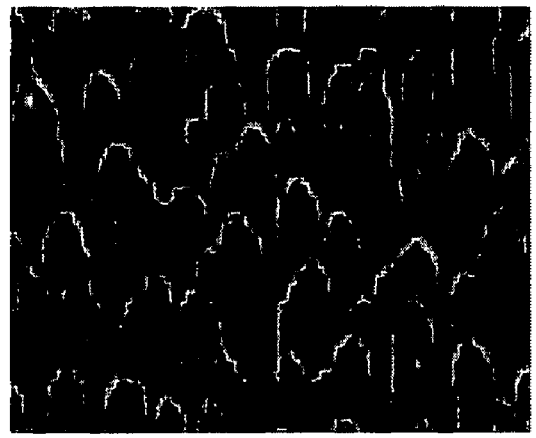
FIG. 5A, FIG. 5B, and FIG. 5C show several shapes of grown zinc oxides (ZnO) having one-dimensional nano structure for forming the ohmic contact layer shown in FIG. 1 to FIG. 4.
Figure 5B:
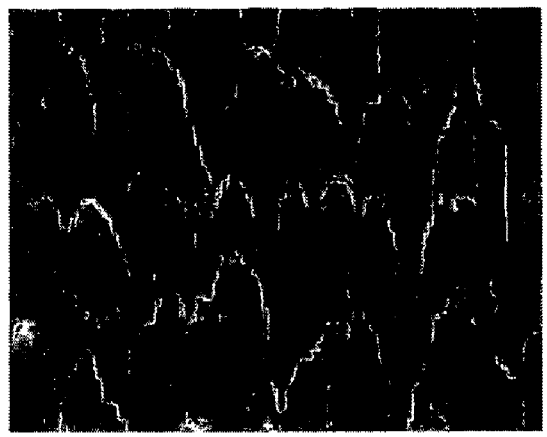
Figure 5C:
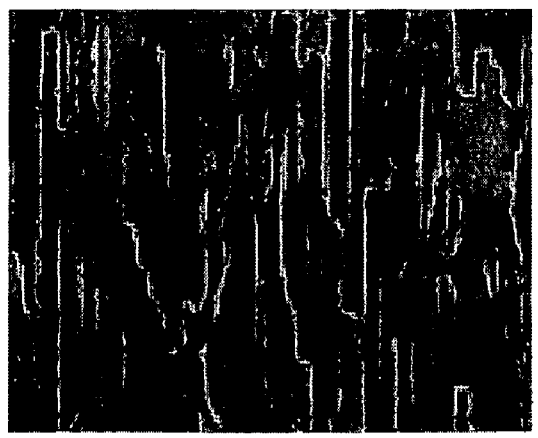

FIG. 5A, FIG. 5B, and FIG. 5C show several shapes of grown zinc oxides (ZnO) having one-dimensional nano structure for forming the ohmic contact layer shown in FIG. 1 to FIG. 4.

The zinc oxides shown in FIG. 5A, FIG. 5B, and FIG. 5C are formed under different process conditions, i.e., at different temperatures and for different process times.

FIG. 6A, FIG. 6B, FIG. 6C, and FIG. 6D show various shapes made by etching zinc oxides (ZnO) having one-dimensional nano structure for forming the ohmic contact layer shown in FIG. 1 to FIG. 4.

Figure 6A:
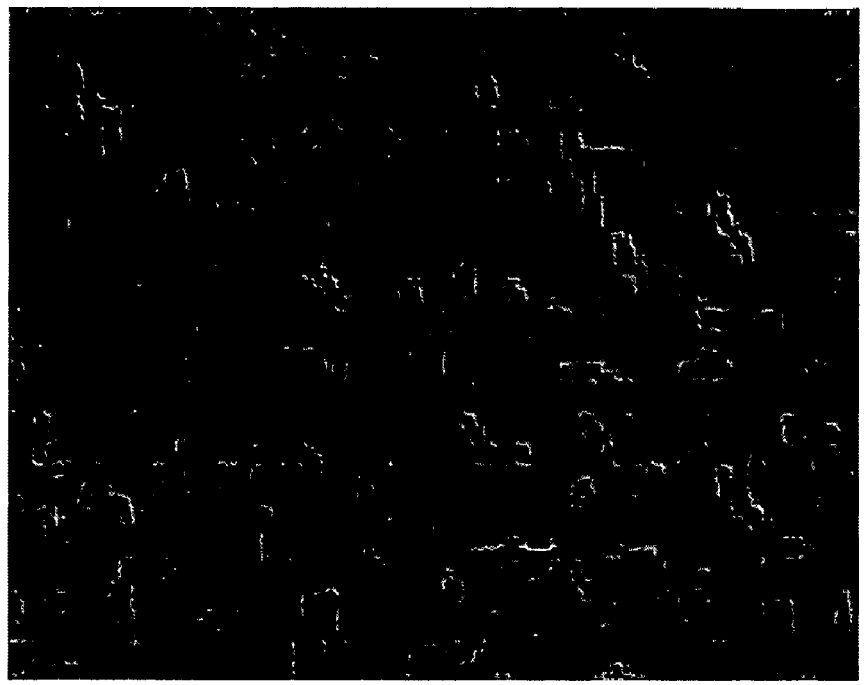
FIG. 6A, FIG. 6B, FIG. 6C, and FIG. 6D show various shapes made by etching zinc oxides (ZnO) having one-dimensional nano structure for forming the ohmic contact layer shown in FIG. 1 to FIG. 4.
Figure 6B:
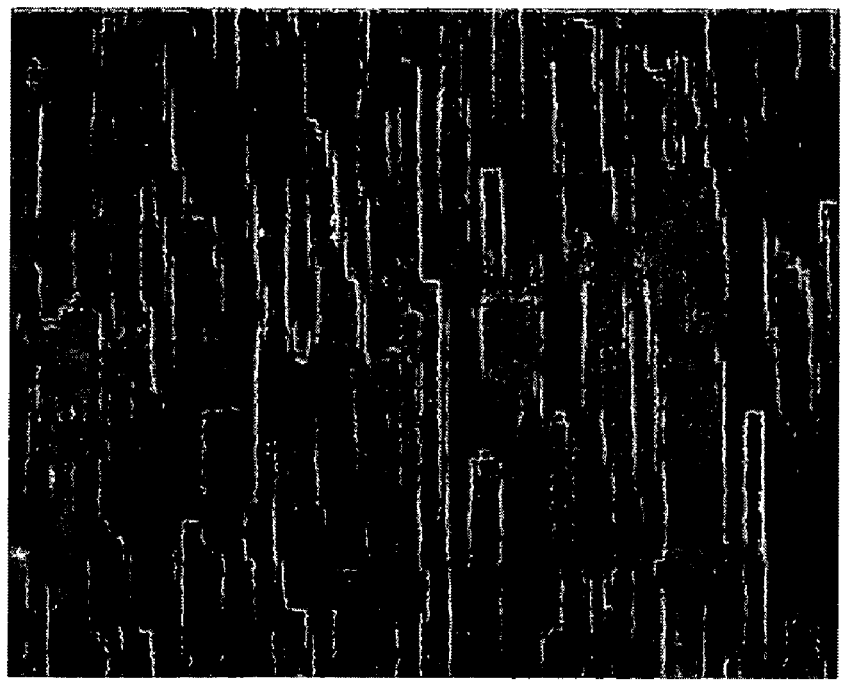
Figure 6C:
Figure 6D:
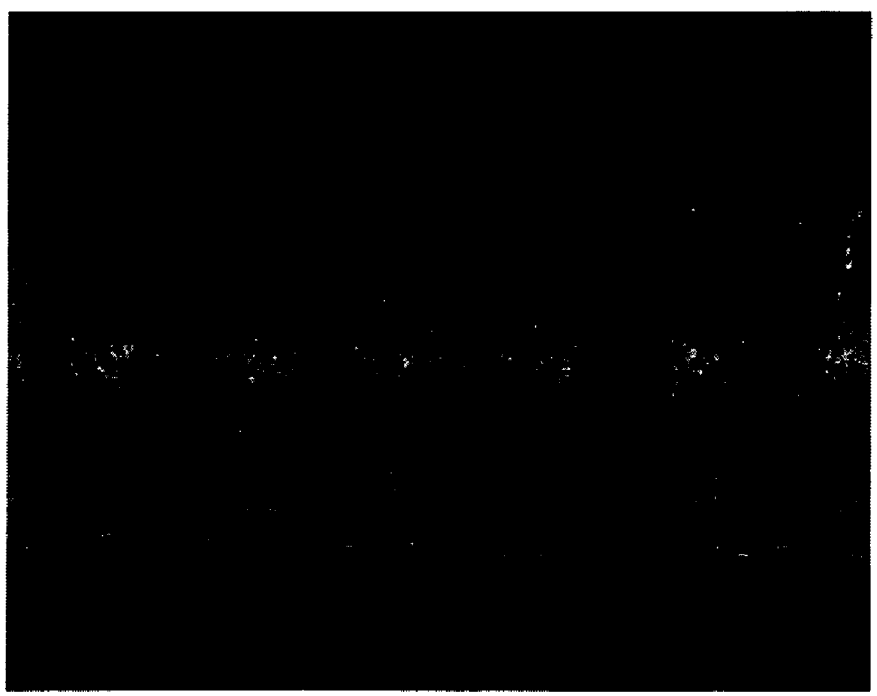

FIG. 6A shows a two-dimensional thin film formed by depositing zinc oxide (ZnO). FIG. 6B, FIG. 6C, and FIG. 6D show zinc oxides made by etching the zinc oxide thin film shown in FIG. 6A under an atmosphere of hydrogen ($H_2$), which have slightly different shapes depending on the process temperature and the process time for the etching.

In order to improve the optical and electrical characteristics of the nano-structured zinc oxide, it is preferable that the zinc oxide is subjected to plasma treatment using ions of oxygen ($O_2$), nitrogen ($N_2$), hydrogen (H2), and at a temperature equal to or lower than about 800° C.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing a light emitting device, the method comprising:
    forming an n-type cladding layer, an active layer, and a p-type cladding layer on a substrate;
    forming a transparent conductive zinc oxide film of an ohmic contact layer, the zinc oxide film having a nano structure; and
    heat treating the zinc oxide film.

2. The method of claim 1, wherein the formation of the zinc oxide film comprising:
    depositing a two-dimensional thin film of zinc oxide; and
    etching and re-growing the two-dimensional thin film under an atmosphere including a hydrogen gas.

3. The method of claim 1, wherein the zinc oxide film comprises at least one of aluminum (Al), chromium (Cr), silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), cadmium (Cd), lanthanum (La), and oxides thereof.

4. The method of claim 1, further comprising:
    forming an ohmic interlayer under the zinc oxide film,
    wherein the ohmic interlayer comprises at least one of metals including Ni, Pd, Pt, Rh, Zn, In, Sn, Ag, Au, Cd, Mg, Be, Mo, V, Cu, Ti, Ir, Ru, W, Co, Mn, and La, transparent conductive oxides including ITO, $SnO_2$, ZnO, $In_2O_3$, $Ga_2O_3$, $RhO_2$, NiO, CoO, PdO, PtO, $CuAlO_2$, CdO, and $CuGaO_2$, and transparent conductive nitrides including TiN, TaN, and SiNx.

5. The method of claim 4, further comprising:
    performing heat treatment after the formation of the ohmic interlayer and before the formation of the zinc oxide film.

6. The method of claim 5, wherein the heat treatment before the formation of the zinc oxide film is performed at a temperature equal to or lower than about 800° C. and under a vacuum or under an atmosphere of oxygen ($O_2$), nitrogen ($N_2$), argon (Ar), hydrogen ($H_2$), or air.

7. The method of claim 1, further comprising:
    performing plasma treatment on the zinc oxide film by using ions of such as oxygen (O2), nitrogen (N2), hydrogen (H2), or argon (Ar) at a temperature equal to or lower than about 800° C.

* * * * *